(12) United States Patent
Chen et al.

(10) Patent No.: US 12,412,845 B2
(45) Date of Patent: Sep. 9, 2025

(54) SEMICONDUCTOR PACKAGES AND METHODS OF MANUFACTURING THE SAME

(71) Applicant: Advanced Semiconductor Engineering, Inc., Kaohsiung (TW)

(72) Inventors: Cheng Yuan Chen, Kaohsiung (TW); Jiming Li, Kaohsiung (TW); Chun Chen Chen, Kaohsiung (TW); Yuanhao Yu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/095,513

(22) Filed: Jan. 10, 2023

(65) Prior Publication Data
US 2023/0145588 A1    May 11, 2023

Related U.S. Application Data

(63) Continuation of application No. 16/264,599, filed on Jan. 31, 2019, now Pat. No. 11,552,026.

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4853* (2013.01); *H01L 21/565* (2013.01); *H01L 23/3121* (2013.01); *H01L 23/49838* (2013.01); *H01L 23/66* (2013.01); *H01L 24/16* (2013.01); *H01Q 1/2283* (2013.01); *H01Q 1/526* (2013.01);
(Continued)

(58) Field of Classification Search
None
See application file for complete search history.

(56) References Cited

U.S. PATENT DOCUMENTS

| 6,686,649 B1 * | 2/2004 | Mathews | H01L 23/552 |
| | | | 257/659 |
| 2013/0120210 A1 * | 5/2013 | Zeiger | H01Q 9/045 |
| | | | 343/841 |

(Continued)

FOREIGN PATENT DOCUMENTS

| CN | 103151327 A | 6/2013 |
| CN | 104617054 A | 5/2015 |

(Continued)

OTHER PUBLICATIONS

Final Office Action for U.S. Appl. No. 16/264,599, issued Oct. 29, 2021, 13 pages.

(Continued)

*Primary Examiner* — Michelle Mandala
*Assistant Examiner* — Jordan M Klein
(74) *Attorney, Agent, or Firm* — FOLEY & LARDNER LLP

(57) ABSTRACT

A semiconductor package includes a substrate, a preformed feeding element, a preformed shielding element, and an encapsulant. The preformed feeding element is disposed on the substrate and the preformed feeding element is disposed on the substrate and adjacent to the preformed feeding element. The encapsulant encapsulates the preformed feeding element and the preformed shielding element.

9 Claims, 13 Drawing Sheets

(51) Int. Cl.
  *H01L 21/56*    (2006.01)
  *H01L 23/00*    (2006.01)
  *H01L 23/31*    (2006.01)
  *H01L 23/498*   (2006.01)
  *H01L 23/66*    (2006.01)
  *H01Q 1/22*     (2006.01)
  *H01Q 1/52*     (2006.01)

(52) U.S. Cl.
  CPC .............. *H01L 2223/6677* (2013.01); *H01L 2224/16227* (2013.01); *H01L 2924/3025* (2013.01)

(56) References Cited

U.S. PATENT DOCUMENTS

| | | |
|---|---|---|
| 2015/0123256 A1 | 5/2015 | Kierse et al. |
| 2016/0351525 A1* | 12/2016 | Chun ................ H01L 23/49811 |
| 2017/0162514 A1* | 6/2017 | Deng .................. H01L 21/4853 |
| 2018/0005957 A1 | 1/2018 | Vincent et al. |
| 2018/0211925 A1 | 7/2018 | Tsai et al. |
| 2018/0219272 A1* | 8/2018 | Baheti .................. H01Q 9/0407 |
| 2020/0035626 A1 | 1/2020 | Ueda |
| 2020/0091128 A1 | 3/2020 | Elsherbini et al. |
| 2020/0343196 A1* | 10/2020 | Tsai .................... H01L 23/3121 |

FOREIGN PATENT DOCUMENTS

| | | |
|---|---|---|
| CN | 107564891 A | 1/2018 |
| TW | 1075648891 A | 12/2018 |

OTHER PUBLICATIONS

Non-Final Office Action for U.S. Appl. No. 16/264,599, issued Apr. 29, 2022, 6 pages.
Non-Final Office Action for U.S. Appl. No. 16/264,599, issued Mar. 19, 2021, 15 pages.
Notice of Allowance for U.S. Appl. No. 16/264,599, issued Sep. 9, 2022, 8 pages.
Office Action for corresponding Chinese Patent Application No. 2019110328388, issued on Dec. 31, 2024, 12 pages.
Search Report with English Translation for corresponding Chinese Patent Application No. 201911032838.8, issued Dec. 31, 2024, 4 pages.

\* cited by examiner

SEMICONDUCTOR PACKAGES AND METHODS OF MANUFACTURING THE SAME

CROSS-REFERENCE TO RELATED APPLICATION

This application is a continuation of U.S. patent application Ser. No. 16/264,599 filed Jan. 31, 2019, now issued as U.S. Pat. No. 11,552,026, the contents of which is incorporated herein by reference in its entirety.

BACKGROUND

1. Technical Field

The present disclosure relates to semiconductor packages and method of manufacturing the same, and, more particularly, to semiconductor packages including at least two semiconductor components and method of manufacturing the same.

2. Description of the Related Art

There is a continuing desire to incorporate more than one semiconductor component into a single semiconductor package to reduce dimensions of the package. A semiconductor package incorporating multiple semiconductor components may be referred to as a system in package (SiP). Because semiconductor components in a semiconductor package specify electrical connections to an external environment, such electrical connections and the process for making the same are important in determining whether the semiconductor components can function properly or can achieve specified performances.

SUMMARY

In an embodiment, a semiconductor package includes a substrate; a preformed feeding element; a preformed shielding element; and an encapsulant. The preformed feeding element is disposed on the substrate and the preformed feeding element is disposed on the substrate and adjacent to the preformed feeding element. The encapsulant encapsulates the preformed feeding element and the preformed shielding element.

In an embodiment, a semiconductor package includes a substrate and a RF structure. The RF structure is disposed on the substrate and includes a feeding element and a shielding element adjacent to the feeding element, wherein a pitch from the feeding element to the shielding element is about 1000 μm to about 1500 μm with the insertion loss≥−0.5 dB under about 0.5 GHz to about 70 GHz.

In an embodiment, a semiconductor package includes a substrate and a RF structure. The RF structure is disposed on the substrate and includes a feeding element and a shielding element adjacent to the feeding element, wherein a pitch from the feeding element to the shielding element is about 1000 μm to about 1500 μm with the return loss≤−10 dB under about 0.5 MHz to about 80 MHz.

In an embodiment, a semiconductor package includes a substrate and a RF structure. The RF structure is disposed on the substrate and includes a feeding element and a shielding element adjacent to the feeding element, wherein a pitch from the feeding element to the shielding element is about 0 μm<Pitch≤about 800 μm with the insertion loss≥−0.5 dB under about 60 GHz to about 75 GHz.

In an embodiment, a semiconductor package includes a substrate and a RF structure. The RF structure is disposed on the substrate and includes a feeding element and a shielding element adjacent to the feeding element, wherein a pitch from the feeding element to the shielding element is about 0 μm<Pitch≤about 800 μm with the return loss≤−10 dB under about 0.5 MHz to about 80 MHz.

In an embodiment, a method of manufacturing includes (a) forming a RF structure on a substrate, the RF structure including a feeding element and a shielding element adjacent to the feeding element; and (b) molding the substrate, the feeding element and the shielding element.

DETAILED DESCRIPTION

Spatial descriptions, such as "top," "side," "over," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1A:
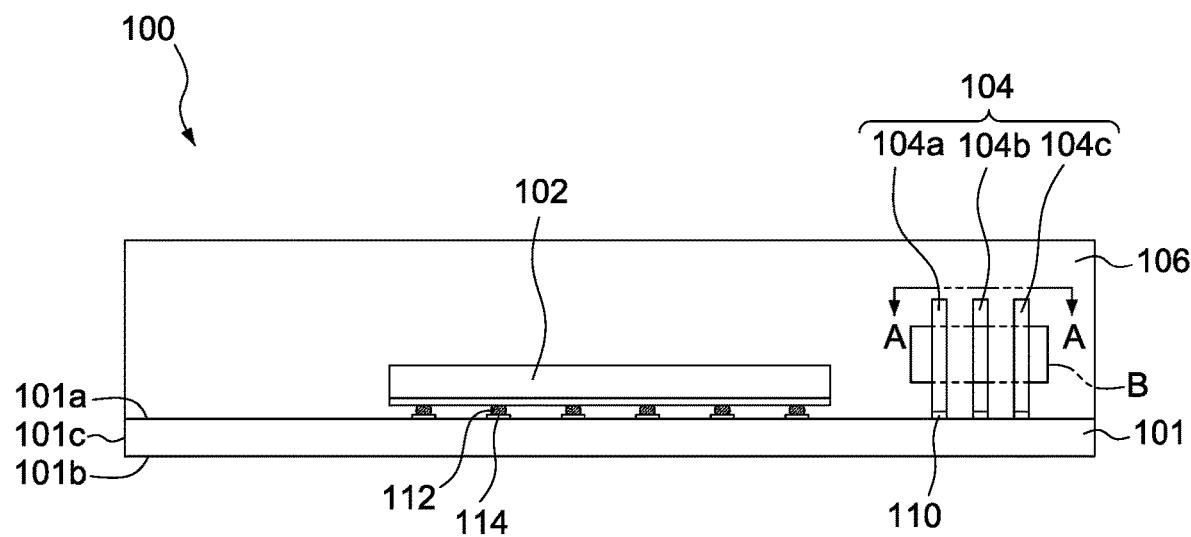
FIG. 1(a) illustrates a cross-sectional view of a semiconductor package according to an embodiment of the present disclosure.

FIG. 1(a) illustrates a cross-sectional view of a semiconductor package 100 according to an embodiment of the present disclosure. The semiconductor package 100 includes a substrate 101, a first semiconductor component 102, a second semiconductor component 104, and an encapsulant 106.

The substrate 101 has a first surface 101a, a second surface 101b, and a side surface 101c. The first surface 101a is opposite to the second surface 101b. The side surface 101c extends between the first surface 101a and the second surface 101b. In the embodiment illustrated in FIG. 1(a), the substrate 101 includes at least one bonding pad 114 disposed adjacent to the first surface 101a of the substrate 101. The bonding pad 114 may be, for example, a contact pad of a trace. In the embodiment of FIG. 1(a), the first surface 101a is an active surface, the bonding pad 114 is a contact pad, and the bonding pad 114 is disposed directly (e.g., in physical contact) on the first surface 101a of the substrate 101. The bonding pad 114 may include, for example, copper, gold, indium, tin, silver, palladium, osmium, iridium, ruthenium, titanium, magnesium, aluminum, cobalt, nickel, or zinc, other metals, metal alloys, or a combination of two or more thereof.

The first semiconductor component 102 is disposed on the first surface 101a of the substrate 101. The first semiconductor component 102 may be any semiconductor component including, for example, a chip, a package, an interposer, or a combination thereof. In the embodiment illustrated in FIG. 1(a), the first semiconductor component 102 is a chip including at least one conductive connector 112. The first conductive connector 112 contacts the bonding pad 114. The conductive connector 112 may be, for example, a pillar structure, which may include an under bump metallization (UBM) layer, a pillar, a barrier layer, a solder layer, or a combination of two or more thereof, or solder/stud bumps.

The second semiconductor component 104 is disposed on the first surface 101a of the substrate 101. The second semiconductor component 104 may be any semiconductor component including, for example, a RF structure. A RF structure may include at least one feeding element and at least one shielding element. According to the present disclosures, the feeding element and the shielding element were pre-formed so that their properties can be pre-determined and formed in any desired shape, for example, including square-like, triangular-like, round-like, rectangular-like, pentagonal-like, hexagonal-like, heptagonal-like, octagonal-like, trapezoidal-like, oval-like, rhombic-like, or parallelogram-like column shape. Unlike a feeding via or shielding via or ground via formed by photolithography in combination with etching (or drilling) and electroplating on a substrate, where the shape of the via fully depends on the drilling or etching technology and the properties of the via fully depends on the electroplating technology, the feeding element and the shielding element according to the embodiments of the present disclosures are pre-formed, for example, by molding, where their shape and properties can be controlled. Therefore, the voids in the feeding via or shielding via or ground via caused by electroplating can be avoided, which can reduce the signal loss.

In the embodiment illustrated in FIG. 1(a), the second semiconductor component 104 includes at least one pre-formed feeding element 104b disposed on the first surface 101a of the substrate 101 and at least one preformed shielding element 104a, 104c disposed on the first surface 101a of the substrate 101 and adjacent to the preformed feeding element 104b. The preformed feeding element 104b and the preformed shielding element 104a, 104c are spaced from each other by a distance. The shielding element 104a, 104c may include a plurality of pieces 104a, 104c spacing apart from each other. The feeding element 104b and the shielding element 104a, 104c may be disposed on the substrate 101 by a surface mount technology (SMT). In the embodiment illustrated in FIG. 1, the feeding element 104b and the shielding element 104a, 104c are disposed on the substrate 101 by a surface mount technology (SMT) with a solder paste 110.

The encapsulant 106 is disposed between the first semiconductor component 102 and the second semiconductor component 104. The encapsulant 106 encapsulates the preformed feeding element 104b and the preformed shielding element 104a, 104c. In the embodiment illustrated in FIG. 1(a), the preformed feeding element 104b defines a first space in the encapsulant 106 and the preformed shielding element 104a, 104c defines a second space in the encapsulant 106, where the encapsulant 106 surrounds them and accommodates the first space and the second space. The encapsulant 106 may extend from the preformed shielding element 104a to the first semiconductor component 102. The encapsulant 106 may cover the first semiconductor component 102, the preformed feeding element 104b, the preformed shielding element 104a, 104c, and the first surface 101a of the substrate 101, but not the side surface 101c of the substrate 101. The encapsulant 106 may be, for example, a solder mask (the material of which is, for example, polyimide (PI)), a passivation layer (the material of which is, for example, a metal oxide), or an underfill. The encapsulant 106 may include fillers, the material of which is, for example, silica and/or carbon for reducing stress on the die and warpage of a resulting semiconductor package.

Figure 1B:
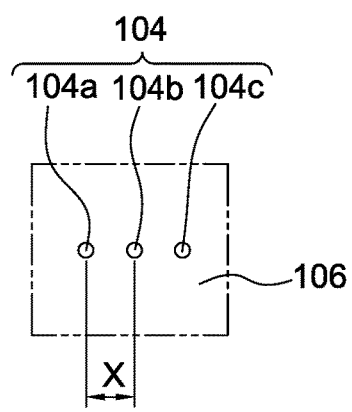
FIG. 1(b) illustrates a top view of the second semiconductor component of FIG. 1(a) along with A-A line in accordance with an embodiment of the present disclosure.

FIG. 1(b) illustrates a top view of the second semiconductor component 104 of FIG. 1(a) along with A-A line in accordance with an embodiment of the present disclosure. The second semiconductor component 104 comprises one feeding element 104b and one shielding element 104a, 104c. The shielding element 104a, 104c surrounds the feeding element 104b. The shielding element 104a, 104c comprises two pieces 104a, 104c spacing apart from each other and includes at least one opening between them. The shielding element 104a, 104c are disposed adjacent to the feeding element 104b and are at the opposite sides of each other. The distance X from the center of the shielding element 104a, 104b to the center of the feeding element 104b (a pitch) is determined according to the desired properties of the second semiconductor component 104.

In an embodiment of the present disclosures, the pitch X can be about 1000 μm to about 1500 μm for a RF structure with an insertion loss≥−0.5 dB under about 0.5 GHz to about 70 GHz.

In an embodiment of the present disclosures, the pitch X can be about 1000 μm to about 1200 μm for a RF structure with an insertion loss≥−0.5 dB under about 0.5 GHz to about 70 GHz.

In an embodiment of the present disclosures, the pitch X can be about 1300 μm to about 1500 μm for a RF structure with an insertion loss≥−0.5 dB under about 0.5 GHz to about 70 GHz.

In an embodiment of the present disclosures, the pitch X can be about 1000 μm to about 1500 μm for a RF structure with a return loss≤−10 dB under about 0.5 MHz to about 80 MHz.

In an embodiment of the present disclosures, the pitch X can be about 1300 μm to 1500 μm with the return loss≤−10 dB under about 0.5 MHz to about 60 MHz.

In an embodiment of the present disclosures, the pitch X can be about 0 μm<Pitch≤800 μm with the insertion loss2−0.5 dB under about 60 GHz to about 75 GHz.

In an embodiment of the present disclosures, the pitch X can be about 0 μm<Pitch≤800 μm with the return loss≤−10 dB under about 60 MHz to about 80 MHz.

Figure 1C:
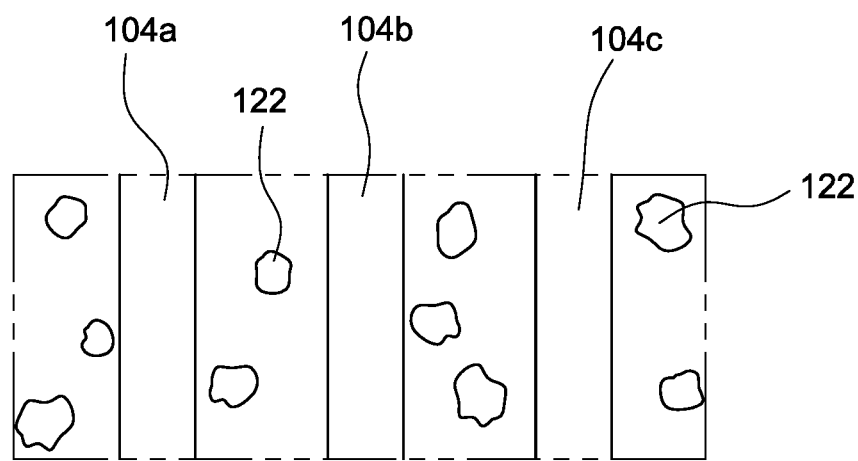
FIG. 1(c) illustrates an enlarged view of an area B of the embodiment of a second semiconductor component illustrated in FIG. 1(a).

The feeding element 104b and the shielding element 104a, 104c are all surrounded by the encapsulant 106. The feeding element 104b and the shielding element 104a, 104c can be in different shape depending on the molding technology or the technology to be used to form them. In the embodiment illustrated in FIG. 1(b), an outer boundary of the feeding element 104b is similar to an outer boundary of the shielding element 104a and an outer boundary of the shielding element 104a can be similar to an outer boundary of the opposite shielding element 104c. In the embodiment illustrated in FIG. 1(b), the feeding element 104b and the shielding elements 104a, 104c have a round-like column shape FIG. 1(c) illustrates an enlarged view of an area B of the embodiment of a second semiconductor component 104 illustrated in FIG. 1(a). In the embodiment illustrated in FIG. 1(c), the encapsulant 106 includes fillers 122. The fillers 122 are adjacent to the feeding element 104b and the shielding elements 104a, 104c. The fillers 122 may be in regular or irregular shape. In the embodiment illustrated in FIG. 1(c), the shape of the fillers 122 remain intact because the feeding element 104b and the shielding elements 104a, 104c are preformed in accordance with the embodiments of the present disclosures rather than formed by photolithography in combination with etching (or drilling) and electroplating. Therefore, the fillers 122 in the encapsulant 106 are not damaged by the etching or drilling and the shape thereof can remain intact. Accordingly, the effect of the fillers 122, such as reducing stress on the die and warpage of a resulting semiconductor package, will not be compromised and can be maintained.

Figure 2:
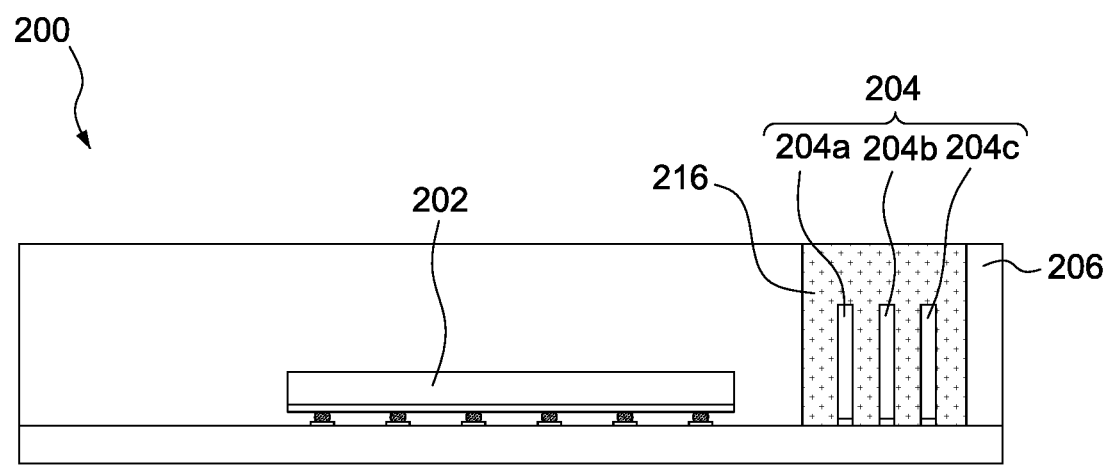
FIG. 2 illustrates a cross-sectional view of a semiconductor package according to an embodiment of the present disclosure.

FIG. 2 illustrates a cross-sectional view of a semiconductor package 200 according to an embodiment of the present disclosure. The semiconductor package 200 in FIG. 2 is similar to the semiconductor package 100 in FIG. 1, with differences including that the semiconductor package 200 includes a first encapsulant 216 and a second encapsulant 206. The first encapsulant 216 is adjacent to the second encapsulant 206. The first encapsulant 216 encapsulates the second semiconductor component 204. In particular, the first encapsulant 216 covers the preformed feeding element 204b, the preformed shielding element 204a, 204c, and the first surface 201a of the substrate 201, but not the side surface 201c of the substrate 201. The second encapsulant 206 covers the first semiconductor component 202 and the first surface 201a of the substrate 201, but not the side surface 201c of the substrate 201. The first encapsulant 216 and the second encapsulant 206 are composed of different materials. The first encapsulant 216 and the second encapsulant 206 may include fillers, the material of which is, for example, silica and/or carbon for reducing stress on the die and warpage of a resulting semiconductor package.

Figure 3A:
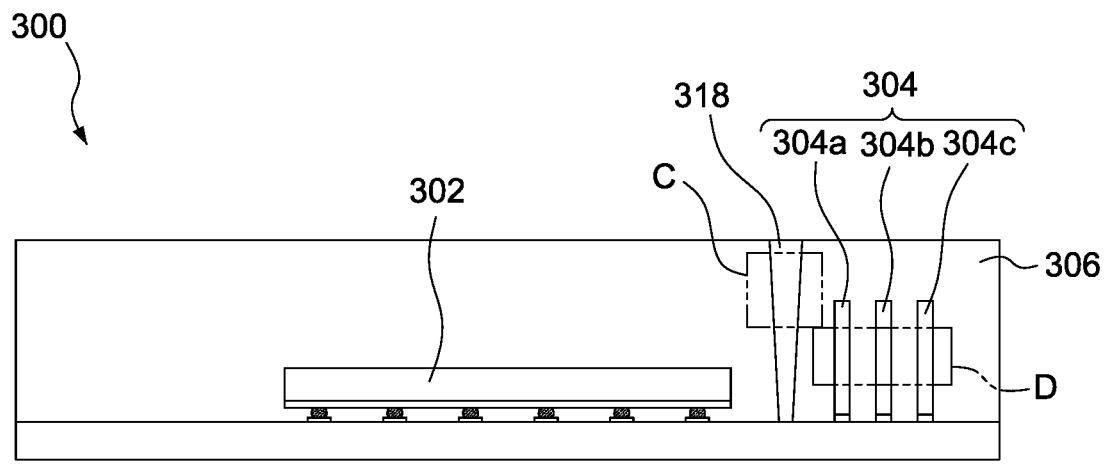
FIG. 3(a) illustrates a cross-sectional view of a semiconductor package according to an embodiment of the present disclosure.

FIG. 3(a) illustrates a cross-sectional view of a semiconductor package 300 according to an embodiment of the present disclosure. The semiconductor package 300 in FIG. 3 is similar to the semiconductor package 100 in FIG. 1, with differences including that the semiconductor package 300 further includes a third semiconductor component 318 disposed in the encapsulant 306. The third semiconductor component 318 is disposed between the first semiconductor component 302 and the second semiconductor component 304. The third semiconductor component 318 may be, for example, a compartment separating the first semiconductor component 302 from the second semiconductor component 304, or a conductive via. In the embodiment illustrated in FIG. 3(a), the third semiconductor component 318 is a conductive via extending through the encapsulant 306 from the substrate 308 to the surface of the encapsulant 306 and formed by drilling (or etching) and electroplating.

Figure 3B:
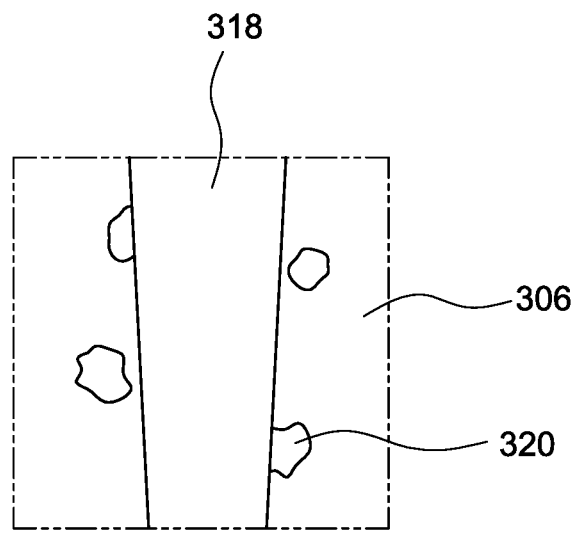
FIG. 3(b) illustrates an enlarged view of an area C of the conductive via of the embodiment of a third semiconductor component illustrated in FIG. 3(a).
Figure 3C:
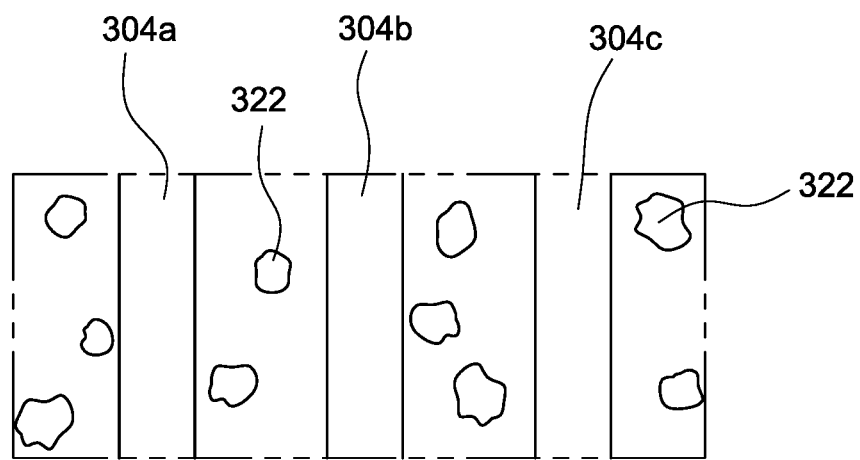
FIG. 3(c) illustrates an enlarged view of an area D of the embodiment of a second semiconductor component illustrated in FIG. 3(a).

FIG. 3(b) illustrates an enlarged view of an area C of the conductive via 318 of the embodiment of a third semiconductor component 318 illustrated in FIG. 3(a). FIG. 3(c) illustrates an enlarged view of an area D of the embodiment of a second semiconductor component 304 illustrated in FIG. 3(a). The encapsulant 306 includes fillers 320 adjacent to the conductive via 318 and fillers 322 adjacent to the feeding element 304b and the shielding elements 304a, 304c. As described above for FIG. 1(c), the fillers 322 adjacent to the feeding element 304b and the shielding elements 304a, 304c remain intact in shape and so are their effects. Contrary to those fillers 322 adjacent to the feeding element 304b and the shielding elements 304a, 304c, fillers 320 adjacent to the conductive via 318 cannot remain intact in shape as they are damaged by a drilling or etching process for forming the conductive via. Accordingly, the effect of the fillers 320 adjacent to a via formed by a drilling or etching process, for example, in reducing stress or warpage of a resulting semiconductor package will be reduced. Therefore, comparing a semiconductor component which is preformed to that is formed by drilling (or etching) and electroplating, the efficacy of an encapsulant adjacent to them will be different and deteriorated.

Figure 4:
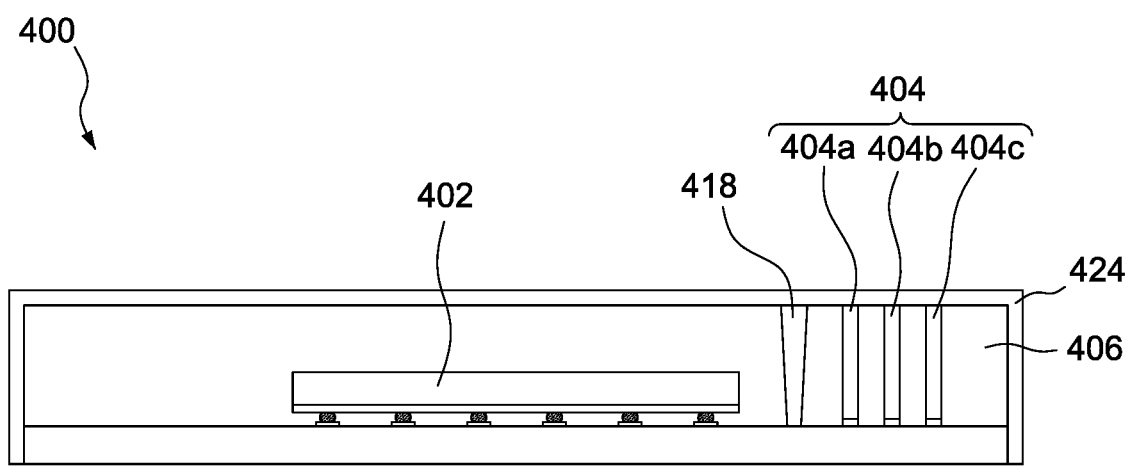
FIG. 4 illustrates a cross-sectional view of a semiconductor package according to an embodiment of the present disclosure.

FIG. 4 illustrates a cross-sectional view of a semiconductor package 400 according to an embodiment of the present disclosure. The semiconductor package 400 in FIG. 4 is similar to the semiconductor package 300 in FIG. 3(a), with differences including that the semiconductor package 400 includes a conductive layer 424 disposed on the encapsulant 406. The conductive layer 424 covers the top surface 406a of the encapsulant 406, the side surfaces 406b, 406c of the encapsulant 406, the exposed surface of the second semiconductor component 404 (including the feeding element 404b and the shielding elements 404a, 404c), and the exposed surface of the third semiconductor component 418.

The conductive layer 424 may be, for example, a shielding layer or a conformal shielding layer.

Figure 5:
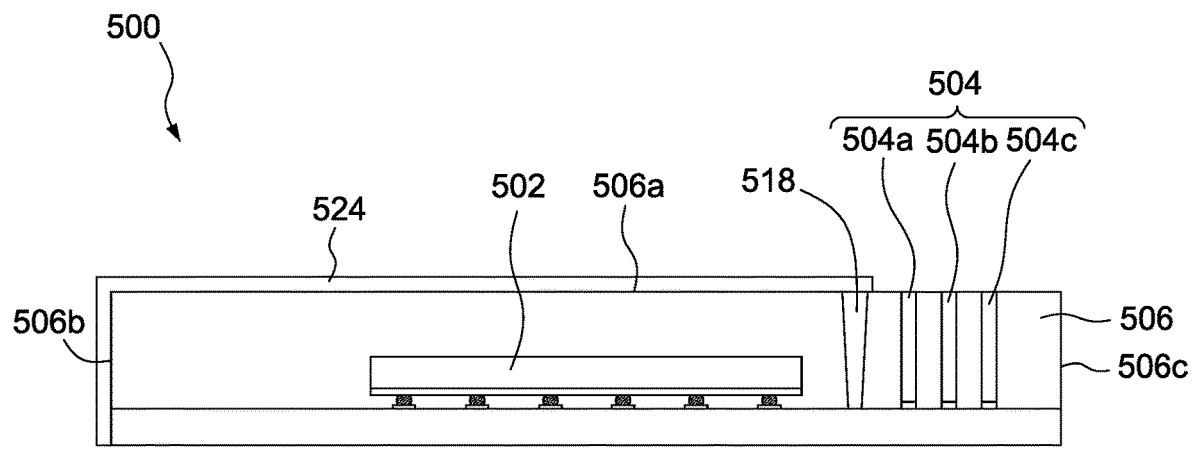
FIG. 5 illustrates a cross-sectional view of a semiconductor package according to an embodiment of the present disclosure.

FIG. 5 illustrates a cross-sectional view of a semiconductor package 500 according to an embodiment of the present disclosure. The semiconductor package 500 in FIG. 5 is similar to the semiconductor package 400 in FIG. 4, with differences including that the conductive layer 524 disposed on the encapsulant 506 covers the top surface 506a of the encapsulant 506, a single one of the side surfaces 506b, 506c of the encapsulant 506, the exposed surface of the third semiconductor component 518, but not the exposed surface of the second semiconductor component 504 (including the feeding element 504b and the shielding elements 504a, 504c).

Figure 6:
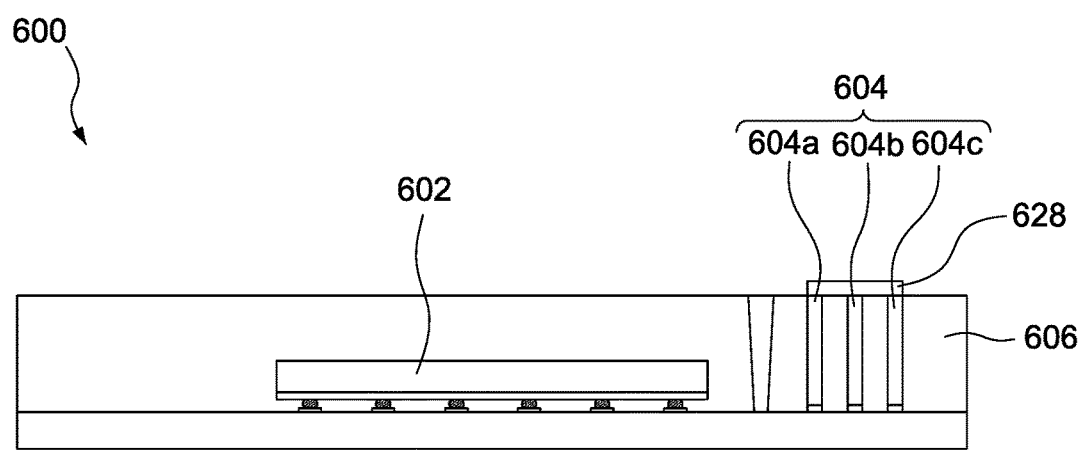
FIG. 6 illustrates a cross-sectional view of a semiconductor package according to an embodiment of the present disclosure.

FIG. 6 illustrates a cross-sectional view of a semiconductor package 600 according to an embodiment of the present disclosure. The semiconductor package 600 in FIG. 6 is similar to the semiconductor package 300 in FIG. 3(a), with differences including that the semiconductor package 600 includes a connector 628 disposed on the encapsulant 606. The connector 628 is disposed adjacent to the second semiconductor component 604. In the embodiment illustrated in FIG. 6, the connector 628 is disposed on the feeding element 604b and the shielding element 604a, 604c. The connector 628 may be, for example, a connector for connecting to an antenna layer.

Figure 7:
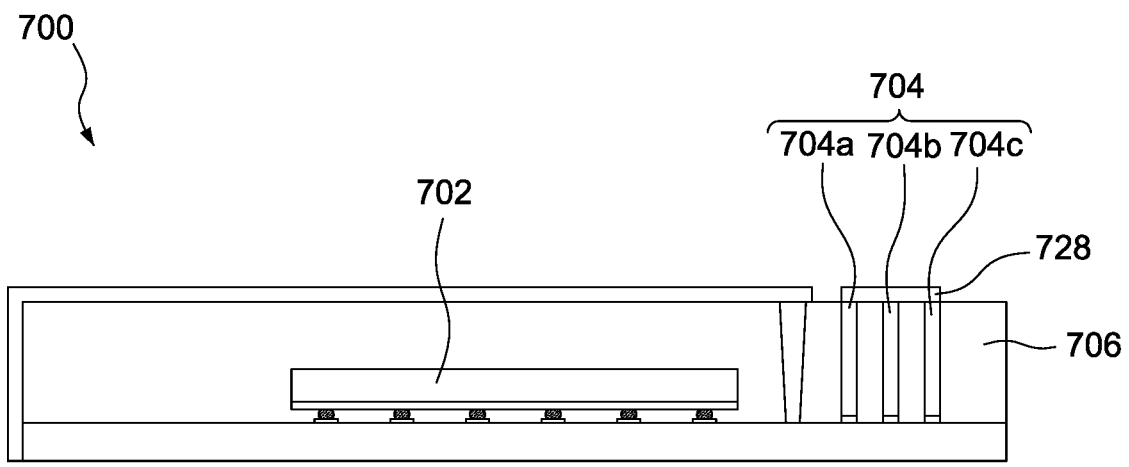
FIG. 7 illustrates a cross-sectional view of a semiconductor package according to an embodiment of the present disclosure.

FIG. 7 illustrates a cross-sectional view of a semiconductor package 700 according to an embodiment of the present disclosure. The semiconductor package 700 in FIG. 7 is similar to the semiconductor package 500 in FIG. 5, with differences including that the semiconductor package 700 includes a connector 728 disposed on the encapsulant 706. The connector 728 is disposed adjacent to the second semiconductor component 704. In the embodiment illustrated in FIG. 7, the connector 728 is disposed on the feeding element 704b and the shielding element 704a, 704c. The connector 728 may be, for example, a connector for connecting to an antenna layer.

Figure 8:
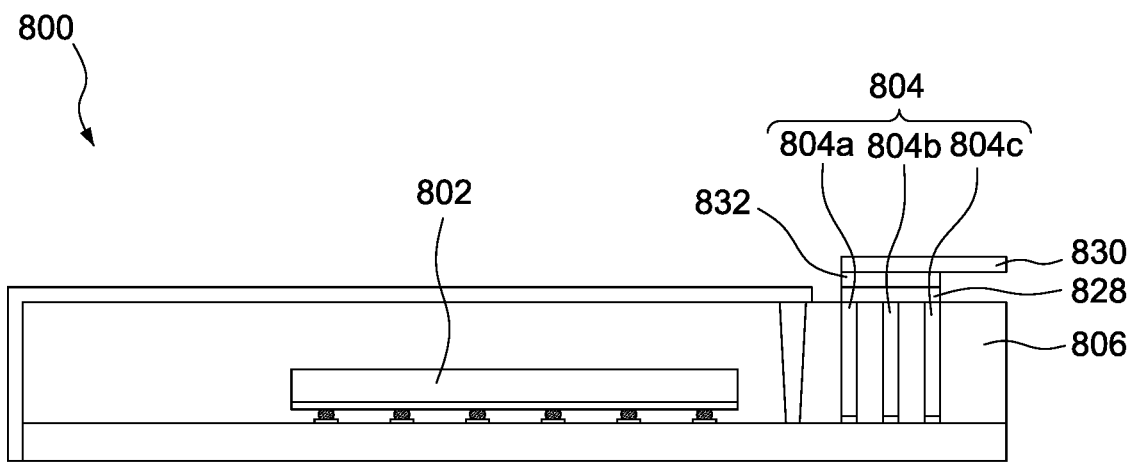
FIG. 8 illustrates a cross-sectional view of a semiconductor package according to an embodiment of the present disclosure.

FIG. 8 illustrates a cross-sectional view of a semiconductor package 800 according to an embodiment of the present disclosure. The semiconductor package 800 in FIG. 8 is similar to the semiconductor package 700 in FIG. 7, with differences including that the semiconductor package 800 includes an antenna layer 830 disposed adjacent to the feeding element 804b and the shielding elements 804a, 804c and electrically connected to the feeding element 804b and the shielding element 804a, 804c. In the embodiment illustrated in FIG. 8, the antenna layer 830 includes a second connector 832 connecting to the first connector 828 disposed on the feeding element 804b and the shielding elements 804a, 804c.

Figure 9:
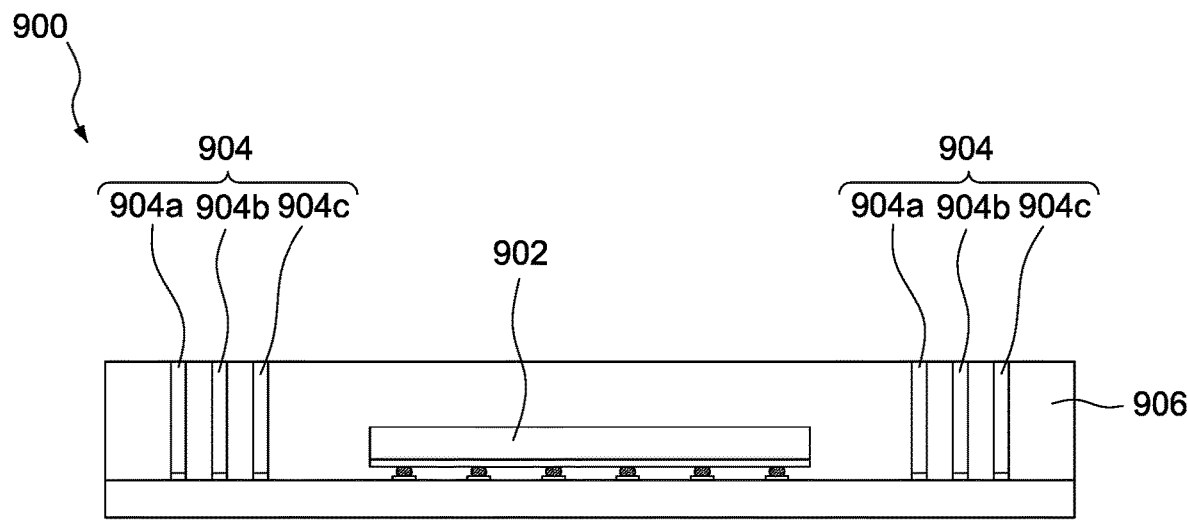
FIG. 9 illustrates a cross-sectional view of a semiconductor package according to an embodiment of the present disclosure.

FIG. 9 illustrates a cross-sectional view of a semiconductor package 900 according to an embodiment of the present disclosure. The semiconductor package 900 in FIG. 9 is similar to the semiconductor package 100 in FIG. 1(a), with differences including that the semiconductor package 900 includes a third semiconductor component 934 disposed on the substrate 908 and the encapsulant 906 exposes the second semiconductor component 904 and the third semiconductor component 934. The third semiconductor component 934 is disposed on the first surface 901a of the substrate 901 and may be at the same side or opposite side of the second semiconductor component 904. The third semiconductor component 934 may be any semiconductor component including, for example, a RF structure, a chip, a package, an interposer, or a combination thereof. The third semiconductor component 934 may be the same or different from the second semiconductor component 904. In the embodiment illustrated in FIG. 9, the third semiconductor component 934 is a RF structure including includes at least one preformed feeding element 934b and at least one preformed shielding element 934a, 934c and disposed at the opposite side of the second semiconductor component 904.

Figure 10A:
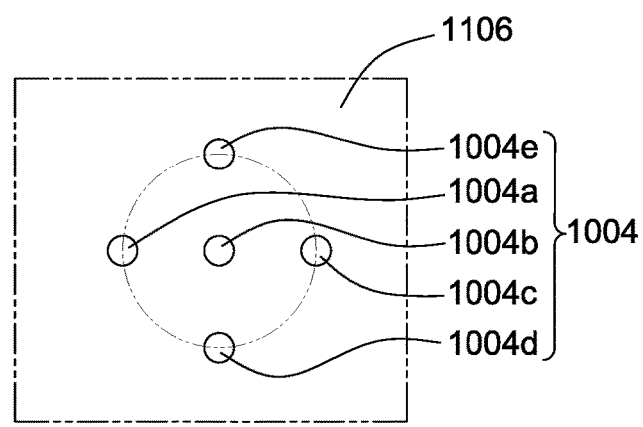
FIG. 10(a) illustrates a top view of a second semiconductor component in accordance with embodiments of the present disclosure.

FIG. 10(a) illustrates a top view of a second semiconductor component in accordance with embodiments of the present disclosure. The second semiconductor component 1004 comprises one feeding element 1004b and four pieces of shielding element 1004a, 1004c, 1004d, 1004e. The four pieces of shielding element 1004a, 1004c, 1004d, 1004e are disposed adjacent to the feeding element 1004b. The four pieces of shielding element 1004a, 1004c, 1004d, 1004e surround the feeding element 1004b. The shielding element 1004a, 1004c, 1004d, 1004e includes an opening between each pieces 1004a, 1004c, 1004d, 1004e. The four pieces of shielding element 1004a, 1004c, 1004d, 1004e are spaced apart from each other by the encapsulant 1006. The four pieces of shielding element 1004a, 1004c, 1004d, 1004e may surround the feeding element 1004b in any arrangement, for example, in a square-like, round-like, rectangular-like, trapezoidal-like, oval-like, rhombic-like, or parallelogram-like arrangement. In the embodiment illustrated in FIG. 10(a), the four pieces of shielding element 1004a, 1004c, 1004d, 1004e surround the feeding element 1004b in a round-like arrangement.

Figure 10B:
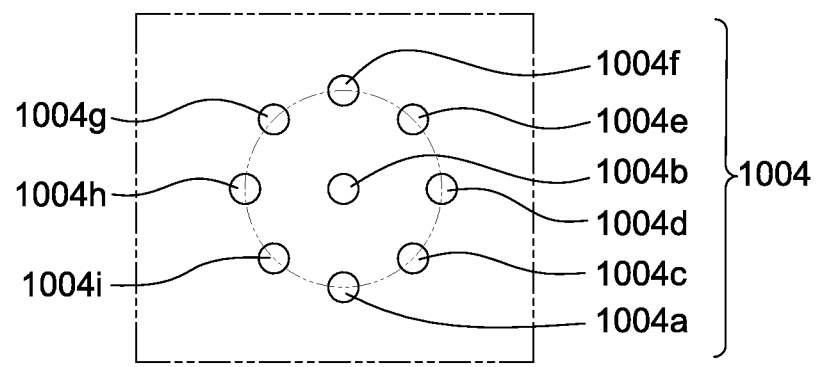
FIG. 10(b) illustrates a top view of a second semiconductor component in accordance with embodiments of the present disclosure.

FIG. 10(b) illustrates a top view of a second semiconductor component in accordance with embodiments of the present disclosure. The second semiconductor component 1005 in FIG. 10(b) is similar to the second semiconductor component 1004 in FIG. 10(a), with differences including that the second semiconductor component 1005 includes eight pieces of shielding element 1004a, 1004c, 1004d, 1004e, 1004f, 1004g, 1004h, 1004i disposed adjacent to the feeding element 1004b. The eight pieces of shielding element 1004a, 1004c, 1004d, 1004e, 1004f, 1004g, 1004h, 1004i surround the feeding element 1004b in a round-like arrangement.

Figure 11A:
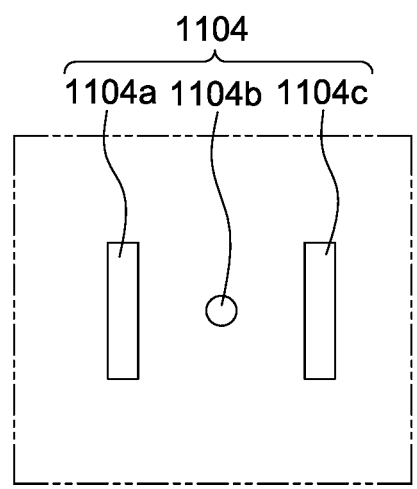
FIG. 11(a) illustrates a top view of a second semiconductor component in accordance with embodiments of the present disclosure.

FIG. 11(a) illustrates a top view of a second semiconductor component in accordance with embodiments of the present disclosure. The second semiconductor component 1104 in FIG. 11(a) is similar to the second semiconductor component 104 in FIG. 1(b), with differences including that the shielding element 1104a, 1104c are preformed in a rectangular-like column shape.

Figure 11B:
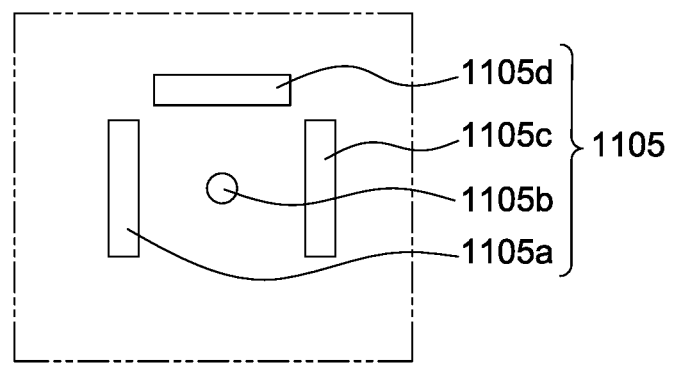
FIG. 11(b) illustrates a top view of a second semiconductor component in accordance with embodiments of the present disclosure.

FIG. 11(b) illustrates a top view of a second semiconductor component in accordance with embodiments of the present disclosure. The second semiconductor component 1105 in FIG. 11(b) is similar to the second semiconductor component 1104 in FIG. 11(a), with differences including that the second semiconductor component 1105 includes three pieces of shielding element 1105a, 1105c, 1105d disposed adjacent to the feeding element 1105b. The three pieces of shielding element 1105a, 1105c, 1105d surround the feeding element 1105b. The three pieces of shielding element 1105a, 1105c, 1105d may surround about ¾ of the surroundings of the feeding element 1105b.

Figure 11C:
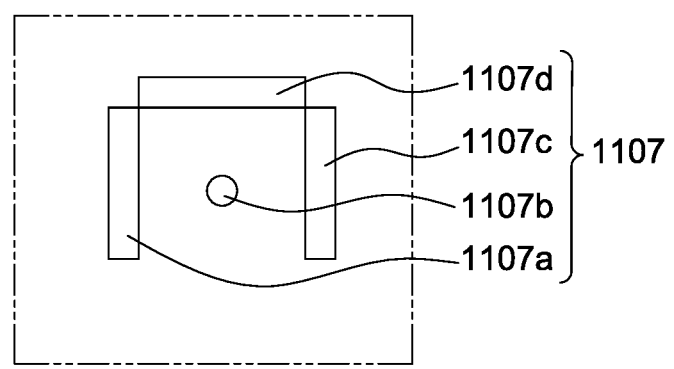
FIG. 11(c) illustrates a top view of a second semiconductor component in accordance with embodiments of the present disclosure.

FIG. 11(c) illustrates a top view of a second semiconductor component in accordance with embodiments of the present disclosure. The second semiconductor component 1107 in FIG. 11(c) is similar to the second semiconductor component 1105 in FIG. 11(b), with differences including that the three pieces of shielding element 1107a, 1107c, 1107d contact each other and there is no opening between each of them.

Figure 11D:
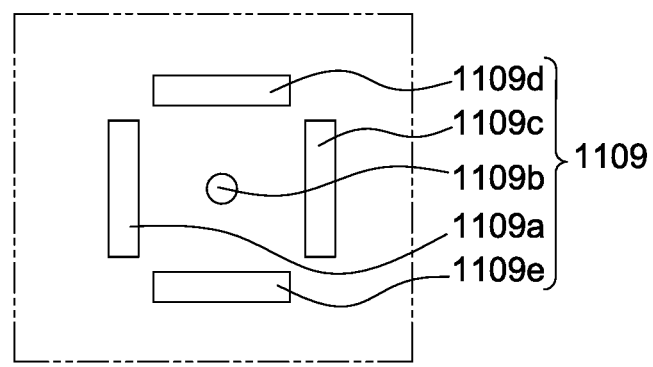
FIG. 11(d) illustrates a top view of a second semiconductor component in accordance with embodiments of the present disclosure.

FIG. 11(d) illustrates a top view of a second semiconductor component in accordance with embodiments of the present disclosure. The second semiconductor component 1109 in FIG. 11(c) is similar to the second semiconductor component 1105 in FIG. 11(b), with differences including that there are four pieces of shielding element 1109a, 1109c, 1109d, 1109e surround the feeding element 1109b. The four pieces of shielding element four pieces of shielding element 1109a, 1109c, 1109d, 1109e surround the feeding element 1109b in a square-like arrangement.

Figure 11E:
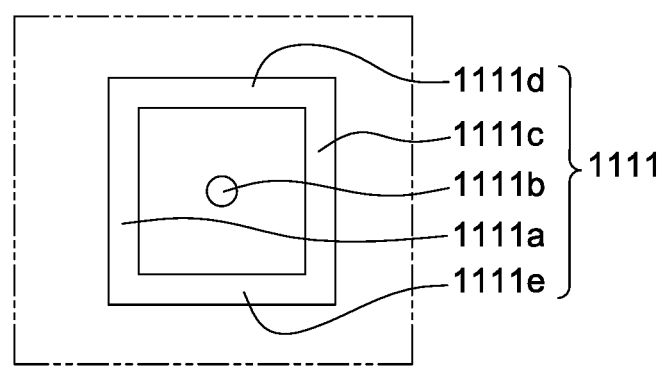
FIG. 11(e) illustrates a top view of a second semiconductor component in accordance with embodiments of the present disclosure.

FIG. 11(e) illustrates a top view of a second semiconductor component in accordance with embodiments of the present disclosure. The second semiconductor component 1111 in FIG. 11(e) is similar to the second semiconductor component 1109 in FIG. 11(d), with differences including that the four pieces of shielding element 1111a, 1111c, 1111d, 111l contact each other and there is no opening between each of them.

Figure 12A:
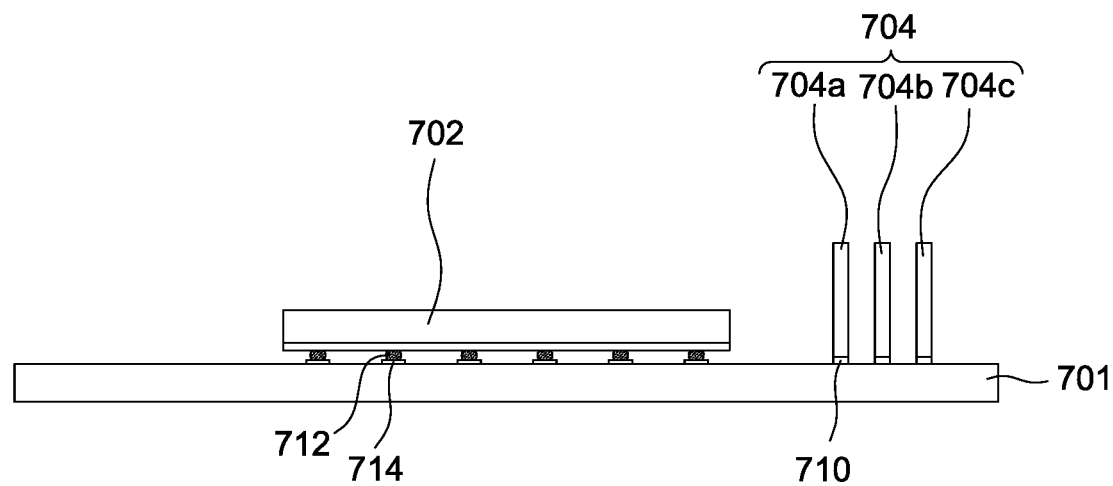
FIGs. 12(a), FIG. 12(b), FIG. 12(c), FIG. 12(d), FIG. 12(e), and FIG. 12(f) illustrate a method for manufacturing a semiconductor package in accordance with embodiments of the present disclosure.
Figure 12B:
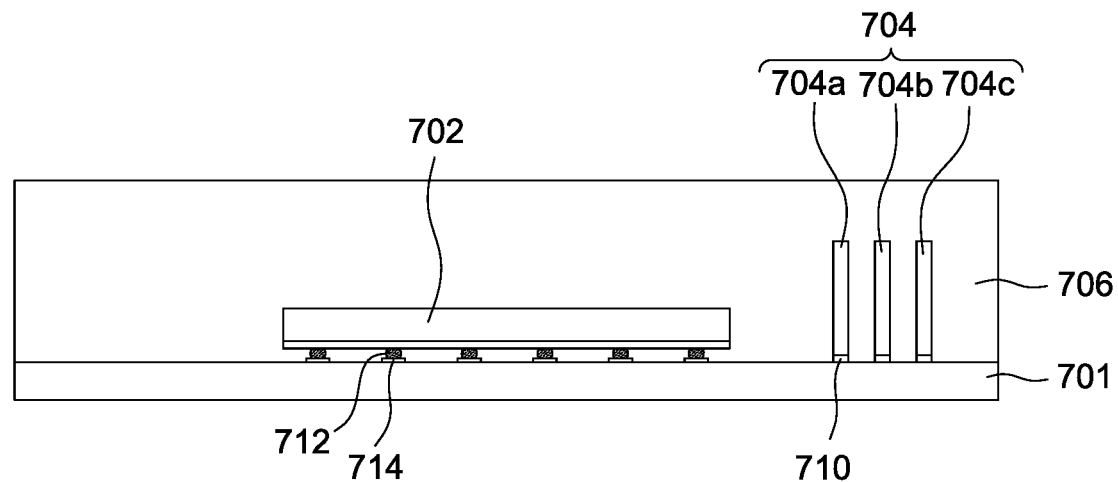
Figure 12C:
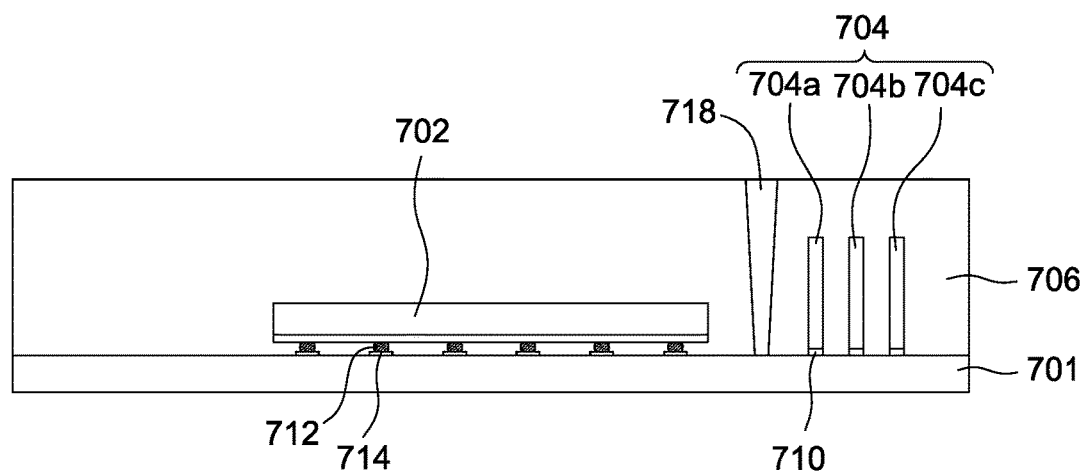

FIGS. 12(a)-12(b) illustrate a method for manufacturing a semiconductor package such as the semiconductor package 100 of FIG. 1(a). FIGS. 12(a)-12(c) illustrate a method for manufacturing a semiconductor package such as the semiconductor package 300 of FIG. 3(a). FIGS. 12(a)-12(d) illustrate a method for manufacturing a semiconductor package such as the semiconductor package 400 of FIG. 4. FIGS. 12(a)-12(e) illustrate a method for manufacturing a semiconductor package such as the semiconductor package 500 of FIG. 5. FIGS. 12(a)-12(f) illustrate a method for manufacturing a semiconductor package such as the semiconductor package 700 of FIG. 7.

Referring to FIG. 12(a), a first semiconductor component 702 and a second semiconductor component 704 are provided on a substrate 701. The first semiconductor component 702 is a chip including at least one conductive connector 712. The second semiconductor component 704 is a RF structure including at least one feeding element 704b and at least one shielding element 704a, 704c. The substrate 701 includes at least one bonding pad 714. The shielding element comprises two pieces 704a, 704c. The feeding element 704b and the shielding element 704a, 704c were preformed in a round-like column shape by a molding technology before being provided on the substrate 701. The preformed feeding element 704b and the preformed shielding element 704c are disposed on the substrate 701 by a surface mounted technology (SMT). The temperature of the SMT process is preferably controlled below about 200° C. The working temperature of the solder paste 710 is preferably below about 200° C. in the SMT process.

Referring to FIG. 12(b), an encapsulant 706 is disposed between the first semiconductor component 702 and the second semiconductor component 704 by, for example, molding. The encapsulant 706 encapsulates the first semiconductor component 702, the preformed feeding element 704b and the preformed shielding element 704a, 704c. The encapsulant 706 covers the first semiconductor component 702, the preformed feeding element 704b and the preformed shielding element 704a, 704c, surrounds the preformed feeding element 704b and the preformed shielding element 704a, 704c, and extends from the preformed shielding element 704a to the first semiconductor component 702. The encapsulant 706 may be, for example, a solder mask (the material of which is, for example, polyimide (PI)) or a passivation layer (the material of which is, for example, a metal oxide) or an underfill. The encapsulant 706 may include a filler, the material of which is, for example, silica and/or carbon.

Referring to FIG. 12(c), a third semiconductor component 718 is disposed in the encapsulant 706. The third semiconductor component 718 is disposed between the first semiconductor component 702 and the second semiconductor component 704. The third semiconductor component 718 may be, for example, a compartment separating the first semiconductor component 702 from the second semiconductor component 704, or a conductive via. The encapsulant 706 defines the location for forming the compartment or the conductive via. The compartment or conductive via may be formed by drilling (or etching) and electroplating. Accordingly, as described above for the encapsulant 706 including fillers adjacent to the compartment or conductive via 718, they cannot remain intact in shape as they are damaged by the drilling or etching process and therefore their effects in the encapsulant 706 as fillers will be deteriorated.

Figure 12D:
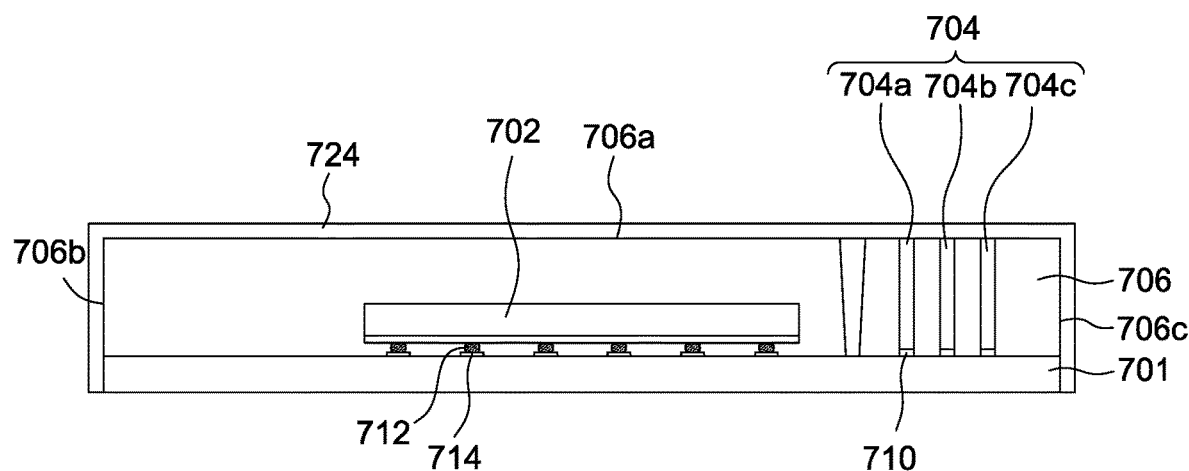

Referring to FIG. 12(d), the encapsulant 706 is ground to expose the second semiconductor component 704. Subsequently, a separation technique (e.g., sawing) is performed to obtain individual semiconductor packages such as the semiconductor package 300 of FIG. 3(a). A conductive layer 724 is disposed on the encapsulant 706 by, for example, a electroplating technology where it covers the top surface 706a of the encapsulant 706, the side surfaces 706b, 706c of the encapsulant 706, the exposed surface of the second semiconductor component 704 (including the feeding element 704b and the shielding elements 704a, 704c), and the exposed surface of the third semiconductor component 718. The conductive layer 724 may be, for example, a shielding layer or a conformal shielding layer.

Figure 12E:
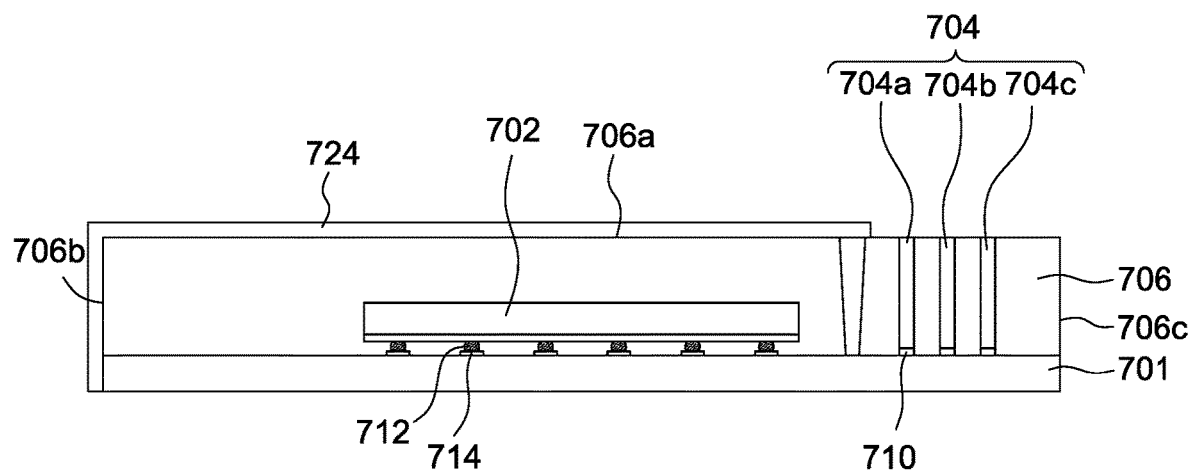

Referring to FIG. 12(e), the conductive layer 724 is disposed on the encapsulant 706 where it selectively covers the top surface 706a of the encapsulant 706, one of the side surfaces 706b, 706c of the encapsulant 706, the exposed surface of the third semiconductor component 718 except for the exposed surface of the second semiconductor component 704. The conductive layer 724 may be, for example, a shielding layer or a conformal shielding layer, and be formed by photolithography in combination with etching and electroplating or physical vapor deposition.

Figure 12F:
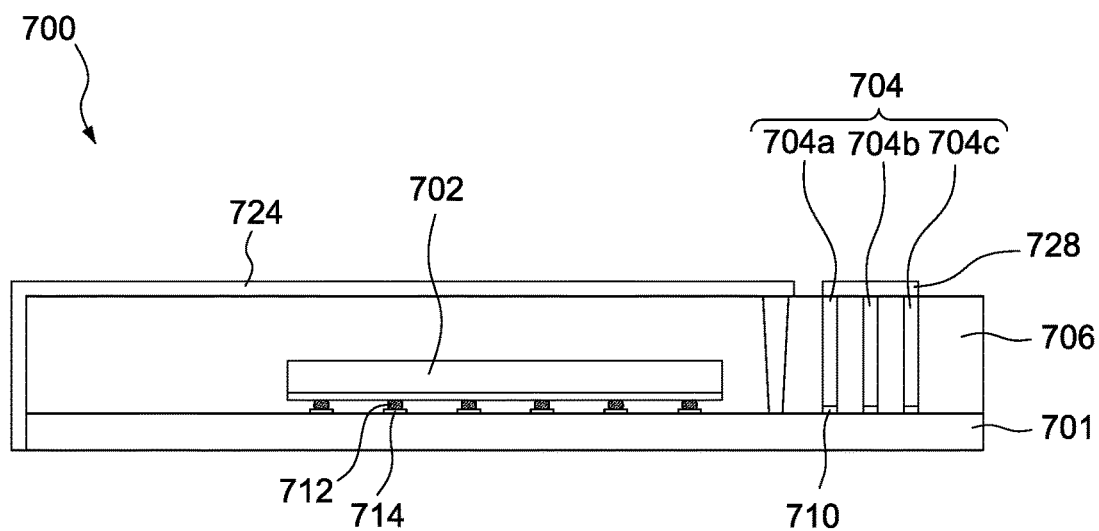

Referring to FIG. 12(f), a connector 728 is disposed on the encapsulant 706. The connector 728 is disposed adjacent to the second semiconductor component 704. In the embodiment illustrated in FIG. 7, the connector 728 is disposed on the feeding element 704b and the shielding elements 704a, 704c. The connector 728 may be, for example, a connector for connecting to an antenna layer. The connector 728 may be formed by photolithography in combination with etching and electroplating or physical vapor deposition.

As used herein and not otherwise defined, the term "about" are used to describe and account for small variations. When used in conjunction with an event or circumstance, the term can encompass instances in which the event or circumstance occurs precisely as well as instances in which the event or circumstance occurs to a close approximation. For example, when used in conjunction with a numerical value, the term can encompass a range of variation of less than or equal to +10% of that numerical value, such as less than or equal to +5%, less than or equal to +4%, less than or equal to #3%, less than or equal to +2%, less than or equal to +1%, less than or equal to +0.5%, less than or equal to +0.1%, or less than or equal to +0.05%.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package, comprising:
a substrate;
an electronic component disposed over the substrate;
a radio frequency (RF) structure disposed over the substrate;
a first encapsulant disposed over the substrate and encapsulating the RF structure; and
a second encapsulant disposed over the substrate and in contact with the first encapsulant, wherein an interface is between the first encapsulant and the second encapsulant, wherein a top surface of the first encapsulant is parallel to a top surface of the second encapsulant, and wherein the RF structure comprises a feeding element and a plurality of shielding elements surrounding the feeding element.

2. The semiconductor package of claim 1, wherein a lateral surface of the RF structure is completely covered by the first encapsulant.

3. The semiconductor package of claim 1, wherein a first distance between a first shielding element of the plurality of shielding elements and a first lateral surface of the first encapsulant is less than a second distance between the feeding element and a second lateral surface of the first encapsulant opposite to the first lateral surface.

4. The semiconductor package of claim 1, wherein the plurality of shielding elements are in a round-like arrangement in a top view.

5. The semiconductor package of claim 1, wherein the plurality of shielding elements are in a square-like arrangement in a top view.

6. A semiconductor package, comprising:
a substrate;
an electronic component disposed over the substrate;
a feeding element disposed over the substrate;
a first shielding element disposed over the substrate and adjacent to the feeding element;
an encapsulant encapsulating the feeding element and exposing a top surface of the feeding element; and
a shielding layer over the encapsulant, wherein a projection of the first shielding element non-overlaps the shielding layer vertically,
wherein the first shielding element and the feeding element are between an edge of the substrate and the electronic component, wherein the first shielding element is closer to the edge of the substrate than the feeding element is.

7. The semiconductor package of claim 6, wherein the first shielding element is a hollow square, and wherein the feeding element is located within the first shielding element in a top view.

8. A semiconductor package, comprising:
a substrate;
an electronic component disposed over the substrate;
a feeding element disposed over the substrate;
a first shielding element disposed over the substrate and adjacent to the feeding element;
an encapsulant encapsulating the feeding element and exposing a top surface of the feeding element;
a shielding layer over the encapsulant, wherein a projection of the first shielding element non-overlaps the shielding layer vertically;
a second shielding element adjacent to the feeding element and opposite to the first shielding element with respect to the feeding element; and
a third shielding element adjacent to the feeding element and between the first shielding element and the second shielding element.

9. The semiconductor package of claim 8, wherein a first imaginary line defined by the feeding element and the first shielding element is perpendicular to a second imaginary line defined by the feeding element and the third shielding element in a top view.

* * * * *